United States Patent
Holland et al.

(10) Patent No.: US 10,854,714 B2
(45) Date of Patent: Dec. 1, 2020

(54) GERMANIUM CONTAINING NANOWIRES AND METHODS FOR FORMING THE SAME

(71) Applicant: Taiwan Semiconductor Manufacturing Co., Ltd., Hsinchu (TW)

(72) Inventors: Martin Christopher Holland, Bertem (BE); Blandine Duriez, Brussels (BE)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 126 days.

(21) Appl. No.: 15/958,954

(22) Filed: Apr. 20, 2018

(65) Prior Publication Data

US 2019/0326394 A1 Oct. 24, 2019

(51) Int. Cl.
| | |
|---|---|
| *H01L 29/06* | (2006.01) |
| *H01L 21/02* | (2006.01) |
| *B82Y 10/00* | (2011.01) |

(52) U.S. Cl.
CPC .... *H01L 29/0669* (2013.01); *H01L 21/02532* (2013.01); *H01L 21/02603* (2013.01); *B82Y 10/00* (2013.01)

(58) Field of Classification Search
CPC ........... H01L 29/7869; H01L 29/78696; H01L 29/78648; H01L 27/1225; H01L 29/66969
See application file for complete search history.

(56) References Cited

U.S. PATENT DOCUMENTS

| | | | |
|---|---|---|---|
| 9,236,267 B2 | 1/2016 | De et al. | |
| 9,502,265 B1 | 11/2016 | Jiang et al. | |
| 9,520,466 B2 | 12/2016 | Holland et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,608,163 B2 * | 3/2017 | Cha .......................... | H01L 33/08 |
| 9,786,774 B2 | 10/2017 | Colinge et al. | |
| 9,853,101 B2 | 12/2017 | Peng et al. | |
| 9,881,993 B2 | 1/2018 | Ching et al. | |
| 2004/0075464 A1 * | 4/2004 | Samuelson .............. | C30B 11/00 |
| | | | 326/37 |
| 2018/0047743 A1 * | 2/2018 | Kwon .................. | H01L 29/0669 |

OTHER PUBLICATIONS

Bryce et al., "Structure and Interfacial Properties of Germanium Nanowires Grown on Titanium," *Electrochemical and Solid-State Letters* 13(9):K77-K79, 2010.

(Continued)

*Primary Examiner* — Tony Tran
(74) *Attorney, Agent, or Firm* — Seed IP Law Group LLP

(57) ABSTRACT

Provided herein are tapered nanowires that comprise germanium and gallium, as well as methods of forming the same. The described nanowires may also include one or more sections of a second semiconductor material. Methods of the disclosure may include vapor-liquid-solid epitaxy with a gallium catalyst. The described methods may also include depositing a gallium seed on a surface of a substrate by charging an area of the substrate using an electron beam, and directing a gallium ion beam across the surface of the substrate.

11 Claims, 7 Drawing Sheets

(56) References Cited

OTHER PUBLICATIONS

Chikyow et al., "Direct Ga deposition by low-energy focused ion-beam system," *Surface Science* 386(1-3):254-258, 1997.
Dick, "A review of nanowire growth promoted by alloys and non-alloying elements with emphasis on Au-assisted III-V nanowires," *Progress in Crystal Growth and Characterization of Materials* 54(3-4):138-173, 2008.
Kim et al., "High-performance Ge/GaAs heterojunction tunneling FET with a channel engineering for sub-0.5V operation," *Semiconductor Science and Technology* 30(3):035020, 2015. (8 pages).
Ma et al., "Electrochemical Liquid-Liquid-Solid Deposition of Crystalline Ge Nanowires as a Function of Ga Nanodroplet Size," *Journal of the Electrochemical Society* 161(7):D3044-D3050, 2014.
Muñoz-Tabares et al., "Deposition of metallic gallium on re-crystallized ceramic material during focused ion beam milling," *Materials Characterization* 86:92-96, 2013.
Zardo et al., "Gallium assisted plasma enchanced chemical vapor deposition of silicon nanowires," *Nanotechnology* 20(15):155602, 2009. (9 pages).

\* cited by examiner

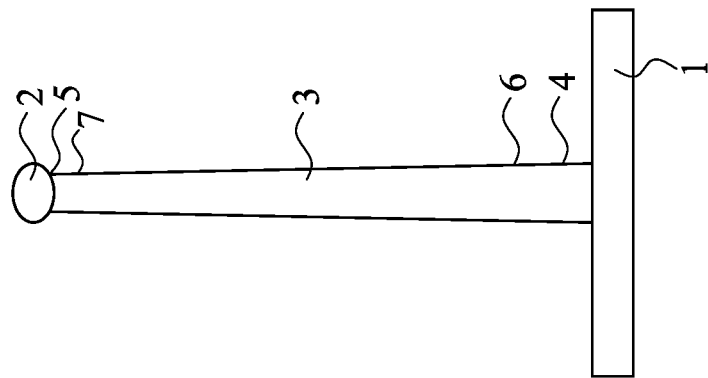
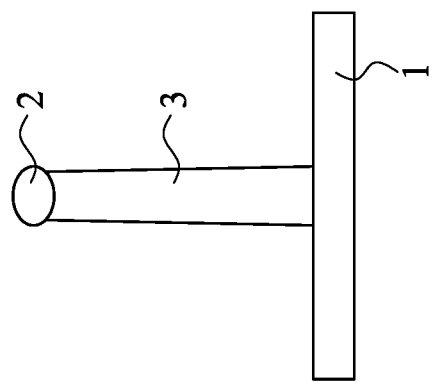
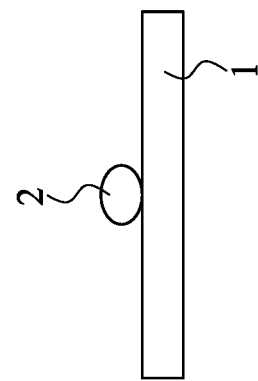
Fig. 1A
Fig. 1B
Fig. 1C

GERMANIUM CONTAINING NANOWIRES AND METHODS FOR FORMING THE SAME

BACKGROUND

Semiconductor nanowires are used in a variety of device applications (e.g., in field effect transistors), and can be produced using several etching or epitaxy techniques. For example, semiconductor nanowires may be produced using vapor-liquid-solid epitaxy. In vapor-liquid-solid epitaxy, a catalyst (referred to herein as a seed) is deposited onto a surface of a substrate. The material that is to be grown is then introduced as a vapor, which is adsorbed on the surface of the seed until reaching a state of supersaturation. As the material reaches supersaturation, nucleation occurs at the liquid-solid interface between the seed and the surface of the substrate, resulting in crystal growth. Thus, the nanowire is formed. Previously, gold has been used as a seed for forming a variety of nanowires, such as germanium nanowires, using vapor-liquid-solid epitaxy. However, the nanowires formed are not compatible with complementary metal-oxide-semiconductor (CMOS) applications.

BRIEF DESCRIPTION OF THE SEVERAL VIEWS OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1C illustrate steps of a method for forming a germanium nanowire using vapor-liquid-solid epitaxy (VLS), in accordance with some embodiments.

DETAILED DESCRIPTION

Figure 2A:
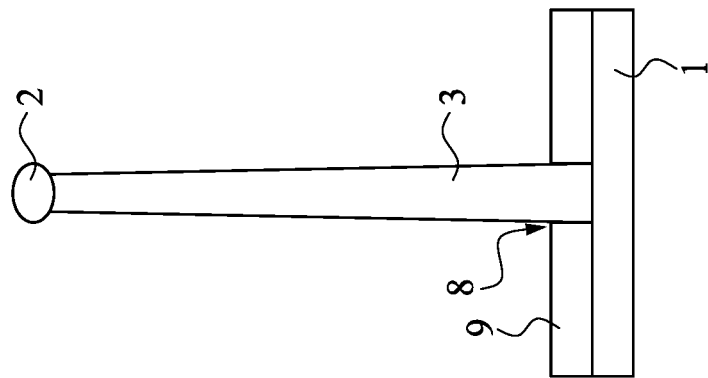
FIGS. 2A-2C illustrate a method of forming a germanium nanowire using VLS, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein include nanowires that comprise germanium (Ge) and gallium (Ga). Such nanowires generally have a tapered profile, meaning that the diameter of the nanowire at a point nearer to the substrate on which it is formed is larger than the diameter at a point that is farther from the substrate. As used herein, "diameter" refers to a cross-sectional diameter of the nanowire measured in an axis perpendicular to the axis of the nanowire's growth. In embodiments, nanowires of the disclosure are produced using vapor-liquid-solid epitaxy (VLS) with Ga being used as the seed. Thus, nanowires of the disclosure are generally compatible with use in complementary metal-oxide-semiconductor (CMOS) applications.

As described in more detail below, embodiments of the described methods include forming a Ga seed on a substrate and forming a Ge nanowire using the Ga seed. In some embodiments, the Ge nanowire is formed by exposing the Ga seed to a Ge vapor. Further embodiments of the described methods include depositing a Ga seed on a surface of a substrate by charging an area of the substrate using an electron beam, and directing a Ga ion beam across (e.g., substantially parallel to) the surface of the substrate. In embodiments, the substrate and the Ga ion beam are considered substantially parallel if any two measurements between the Ga ion beam and the closest point of the substrate are within ±20% of each other. In some embodiments, the substrate and the Ga ion beam are considered substantially parallel if any two measurements between the Ga ion beam and the closest point of the substrate are within ±15% of each other. In some embodiments, the substrate and the Ga ion beam are considered substantially parallel if any two measurements between the Ga ion beam and the closest point of the substrate are within ±10% of each other. In further embodiments, the substrate and the Ga ion beam are considered substantially parallel if any two measurements between the Ga ion beam and the closest point of the substrate are within ±5% of each other. In still further embodiments, the substrate and the Ga ion beam are considered substantially parallel if any two measurements between the Ga ion beam and the closest point of the substrate are within ±1% of each other.

FIGS. 1A-1C illustrate the steps of a method of the disclosure, in accordance with some embodiments. As shown in FIG. 1A, a Ga seed 2 (e.g., a liquid droplet of Ga) is deposited on a surface of a substrate 1. Any suitable substrate may be used. In embodiments, substrate 1 is a semiconductor material, e.g., silicon (Si), Ge, a Si—Ge alloy, gallium arsenide (GaAs), indium arsenide (InAs), indium gallium arsenide (InGaAs) and/or indium phosphide (InP), and the like. Silicon-on-insulator may also be a suitable substrate. In other embodiments, substrate 1 is or includes a dielectric layer, e.g., an oxide such as silicon dioxide, aluminum oxide, and the like. In other embodiments, substrate 1 a high dielectric constant dielectric layer selected from one or more of hafnium oxide ($HfO_2$), hafnium silicon oxide (HfSiO), hafnium silicon oxynitride (HfSiON), hafnium tantalum oxide (HMO), hafnium titanium oxide (HMO), hafnium zirconium oxide (HfArO), combinations thereof, and/or other suitable materials. In other embodiments, substrate 1 is a low dielectric constant layer. In yet further embodiments, the substrate 1 is a conductive material, e.g., a metal or metal compound, such as ruthenium (Ru), palladium (Pd), platinum (Pt), cobalt (Co), nickel (Ni), and/or conductive metal oxides and other suitable P-type metal materials and may include hafnium (Hf), zirconium (Zr), titanium (Ti), tantalum (Ta), aluminum (Al), aluminides, and/or conductive metal carbides (e.g., hafnium carbide, zirconium carbide, titanium carbide, and aluminum carbide), and other suitable materials for N-type metal materials.

Ga seed 2 may be deposited using any suitable methods for forming a Ga seed on a substrate. Exemplary methods are described below with regard to FIGS. 3A-3C and FIGS. 5A-5C. Generally, the diameter of the Ga seed controls the diameter of the resulting nanowire. In other words, depositing a Ga seed with a smaller diameter will result in a nanowire with a smaller diameter. The method of depositing the Ga seed may therefore be chosen based on the desired diameter of the Ga seed, and, by extension, of the resulting nanowire.

In embodiments, Ga seed 2 has a diameter of no more than about 60 nm. In embodiments, Ga seed 2 has a diameter of no more than about 25 nm. In some embodiments, Ga seed 2 has a diameter of no more than about 20 nm. In some embodiments, Ga seed 2 has a diameter of no more than about 15 nm. In some embodiments, Ga seed 2 has a diameter of no more than about 10 nm. In certain embodiments, Ga seed 2 has a diameter ranging from about 3 nm to about 10 nm. "About," as used herein, denotes that the actual value may be somewhat more or somewhat less than the stated value or range, to within ±20% of the stated value. In embodiments, about means that the actual value is within ±15% of the stated value. In embodiments, about means that the actual value is within ±10% of the stated value. In embodiments, about means that the actual value is within ±5% of the stated value. In embodiments, about means that the actual value is within ±1% of the stated value.

As shown in FIG. 1B, Ge nanowire 3 is formed using the Ga seed 2. In embodiments, the Ge nanowire 3 is formed using VLS. In such embodiments, Ga seed 2 is exposed to a vapor that includes Ge. In embodiments, chemical vapor deposition (CVD) is used to expose Ga seed 2 to the vapor. In such embodiments, the chemical vapor deposition may be metalorganic CVD (MOCVD). In such embodiments, the vapor may be a volatile precursor that reacts or decomposes to deposit Ge on the surface of Ga seed 2. In some embodiments, the vapor includes $Ge_2H_6$. In other embodiments, the vapor includes $GeH_4$.

The Ge nanowire 3 may be formed using any suitable processing parameters (e.g., temperature, pressure, flow rate, etc.). In embodiments, Ga seed 2 is exposed to the vapor at a temperature that is no more than about 500° C. In some embodiments, Ga seed 2 is exposed to the vapor at a temperature ranging from about 330° C. to about 500° C. In various embodiments, Ga seed 2 is exposed to the vapor at a temperature that is no more than about 450° C. In some embodiments, Ga seed 2 is exposed to the vapor at a temperature ranging from about 330° C. to about 450° C. In various embodiments, Ga seed 2 is exposed to the vapor at a temperature that is no more than about 400° C. In some embodiments, Ga seed 2 is exposed to the vapor at a temperature ranging from about 330° C. to about 400° C. In embodiments, Ga seed 2 is exposed to the vapor at a pressure that is no more than about 100 Torr. In various embodiments, Ga seed 2 is exposed to the vapor at a pressure that is no more than about 50 Torr. In some embodiments, Ga seed 2 is exposed to the vapor at a pressure that ranges from about 10 Torr to about 100 Torr. In certain embodiments, Ga seed 2 is exposed to the vapor at a pressure that ranges from about 10 Torr to about 50 Torr. In embodiments, the vapor has a flow rate ranging from about 50 sccm (standard cubic centimeters per minute) to about 800 sccm.

Nanowire 3 includes Ge and Ga. Ga is generally present throughout nanowire 3 at doping concentrations. In embodiments, a concentration of Ga in nanowire 3, or a section thereof, is at least about $1 \times 10^{16}/cm^3$. In various embodiments, a concentration of Ga in nanowire 3, or a section thereof, is at least about $5 \times 10^{16}/cm^3$. In some embodiments, a concentration of Ga in nanowire 3, or a section thereof, ranges from about $1 \times 10^{16}/cm^3$ to about $1 \times 10^{20}/cm^3$. In certain embodiments, a concentration of Ga in nanowire 3, or a section thereof, ranges from about $5 \times 10^{16}/cm^3$ to about $1 \times 10^{20}/cm^3$.

In embodiments, the concentration of Ga in nanowire 3 of the disclosure is substantially constant through the length of nanowire 3. In some embodiments, the concentration of Ga at two locations in nanowire 3 varies by no more than 20%. In some embodiments, the concentration of Ga at two locations in nanowire 3 varies by no more than 10%. In particular embodiments, the concentration of Ga at two locations in nanowire 3 varies by no more than 5%. In certain embodiments, the concentration of Ga at two locations in nanowire 3 varies by no more than 1%.

Further, nanowire 3, or a section thereof, may be doped. In some embodiments, nanowire 3, or a section thereof, is doped with n-type dopant(s). In some embodiments, nanowire 3, or a section thereof, is doped with p-type dopant(s).

As illustrated in FIG. 1C, nanowire 3 has a first end 4 nearest to the substrate 1, and a second end 5 nearest to the Ga seed 2. In embodiments, the diameter of a section of nanowire 3 tapers (i.e., has a decreasing diameter) from a first location 6, which is nearer to the first end 4, to a second location 7, which is nearer to the second end 5. In other words, the diameter of a nanowire 3 is larger at a first location 6 than the diameter of nanowire 3 at a second location 7.

In embodiments, the first location 6 and the second location 7 are the first end 4 and the second end 5, respectively. Thus, in embodiments, the diameter of a nanowire 3 tapers from the first end 4 to the second end 5. In embodiments, the taper is continuous through the length of the nanowire. In some embodiments, the degree of the taper (i.e., the rate of decrease in the diameter) is substantially constant through the length of the nanowire. In some embodiments, the diameter at the first end 4 is no more than twice as large as the diameter at the second end 5. In some embodiments, the diameter at the first end 4 is at least 1 nm larger than the diameter at the second end 5. In some embodiments, the diameter at the first end 4 is at least 5 nm larger than the diameter at the second end 5. In some embodiments, the diameter at the first end 4 is at least 10 nm larger than the diameter at the second end 5.

Nanowire 3 may have any desired diameter. In embodiments, the diameter of nanowire 3 at the first location 6, the second location 7, or both, is independently no more than about 60 nm. In embodiments, the diameter of nanowire 3 at the first location 6, the second location 7, or both, is independently no more than about 25 nm. In some embodiments, the diameter of nanowire 3 at the first location 6, the second location 7, or both, is independently no more than about 20 nm. In some embodiments, the diameter of nanowire 3 at the first location 6, the second location 7, or both, is independently no more than about 15 nm. In some embodiments, the diameter of nanowire 3 at the first location 6, the second location 7, or both, is independently no more than about 10 nm. In certain embodiments, the diameter of nanowire 3 at the first location 6, the second location 7, or both, independently ranges from about 3 nm to about 25 nm. In certain embodiments, the diameter of nanowire 3 at the first location 6, the second location 7, or both, independently ranges from about 3 nm to about 20 nm. In certain embodiments, the diameter of nanowire 3 at the first location 6, the second location 7, or both, independently ranges from about 3 nm to about 10 nm.

In embodiments, nanowire 3 has an average diameter of no more than about 60 nm. In embodiments, nanowire 3 has an average diameter of no more than about 25 nm. In some embodiments, nanowire 3 has an average diameter of no more than about 20 nm. In some embodiments, nanowire 3 has an average diameter of no more than about 15 nm. In some embodiments, nanowire 3 has an average diameter of no more than about 10 nm. In certain embodiments, nanowire 3 has an average diameter ranging from about 3 nm to about 10 nm. As used herein, the phrase "average diameter" refers to the arithmetic mean of at least two diameter measurements taken at different locations along the length of the nanowire. In some embodiments, average diameter refers to the arithmetic mean of at least five diameter measurements taken at different locations along the length of the nanowire.

Additionally, in embodiments, Ga seed 2 is present at the second end 5 of nanowire 3, as shown in FIGS. 1A-1C. In embodiments, Ga seed 2 may be present at the second end 5 of the nanowire 3 after the formation process. In other embodiments, the Ga seed 2 may be removed after formation of the nanowire 3 using any suitable methods (e.g., etching).

Unlike nanowires produced by etching techniques, which causes surface damage to the sidewalls of nanowires, the sidewalls of nanowires of the disclosure have an ordered crystalline surface. In other words, the nanowires of the disclosure have smooth sidewalls, whereas the sidewalls of nanowires formed by etching have rough surfaces due to damage caused during the etching process. Any suitable technique may be used to confirm that the crystal structure is ordered. For example, transmission electron microscopy (TEM) can be used to view the crystalline surface. In embodiments, the crystal structure of the nanowire corresponds to the crystal structure of the substrate on which the nanowire is formed.

The methods of the disclosure are able to produce Ge nanowires with at least one substantially straight section. As used herein, a "substantially straight" nanowire, or section thereof, has a ratio of effective length to actual length of about one. In embodiments, a substantially straight nanowire, or section thereof, has a ratio of effective length ranging from about 0.8 to about 1.0. In some embodiments, a substantially straight nanowire, or section thereof, has a ratio of effective length ranging from about 0.9 to about 1.0. In some embodiments, a substantially straight nanowire, or section thereof, has a ratio of effective length ranging from about 0.95 to about 1.00. "Effective length" of a nanowire, or section thereof, refers to the shortest distance between the two distal ends of a nanowire, or section thereof, as measured by transmission electron microscopy (TEM) in bright field mode at 5 keV. "Actual length" of a nanowire, or section thereof, refers to the distance between the two distal ends of a nanowire, or section thereof, as traced through the nanowire as measured by TEM in bright field mode at 5 keV. The ratio of effective length to actual length is determined by dividing the effective length by the actual length. In some embodiments, the nanowires, or section thereof, of the present disclosure have a ratio of effective length to actual length equal to one. In embodiments, a substantially straight section of a Ge nanowire is at least about 1 μm long. In some embodiments, a substantially straight section of a Ge nanowire is at least about 3 μm long. In some embodiments, a substantially straight section of a Ge nanowire ranges from about 1 μm to about 5 μm long.

Figure 2B:
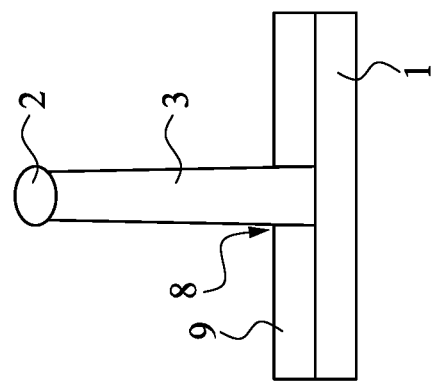
Figure 2C:
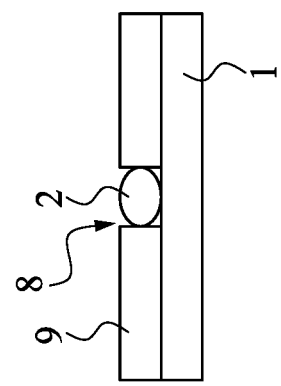

FIGS. 2A-2C illustrate steps of a method of the disclosure, in accordance with some embodiments. As shown in FIG. 2A, Ga seed 2 is deposited into a recess 8 in a dielectric layer 9 on the substrate 1.

In embodiments, the diameter of recess 8 corresponds to the diameter of Ga seed 2, and thus the diameter of the resulting nanowire 3. In embodiments, recess 8 has a diameter of no more than about 60 nm. In embodiments, recess 8 has a diameter of no more than about 25 nm. In some embodiments, recess 8 has a diameter of no more than about 20 nm. In some embodiments, recess 8 has a diameter of no more than about 15 nm. In some embodiments, recess 8 has a diameter of no more than about 10 nm. In certain embodiments, recess 8 has a diameter ranging from about 3 nm to about 10 nm.

Figure 3:
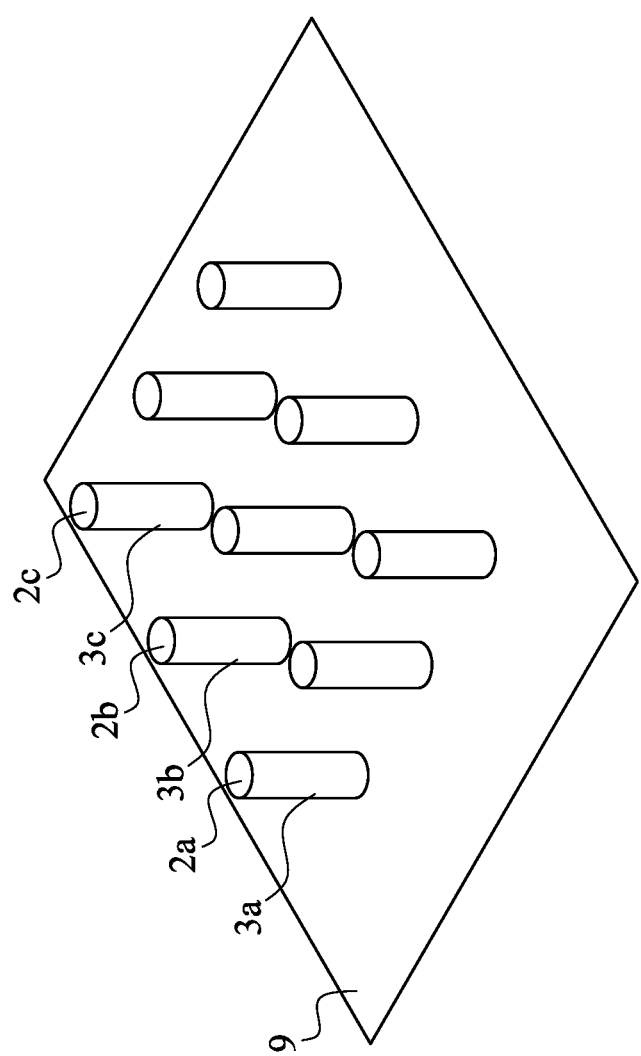
FIG. 3 shows an array of germanium nanowires, in accordance with some embodiments.

Recesses may be formed in dielectric layer 5 in any suitable pattern using known techniques, e.g., photolithography and etching, thus allowing an array of nanowires 3a-3c to be formed using Ga seeds 2a-2c, as shown in FIG. 3. As shown in FIG. 4, such techniques may be used to form an array of nanowires of the disclosure. In such embodiments, the nanowires of the disclosure are grown in a single direction and show ordered growth. Such single directional growth may be advantageous as compared to other methods of growing nanowires that result in multidirectional growth.

Returning to FIG. 2B and FIG. 2C, Ge nanowire 3 is formed using the Ga seed 2, as described above with regard to FIG. 1B and FIG. 1C.

Figure 4B:
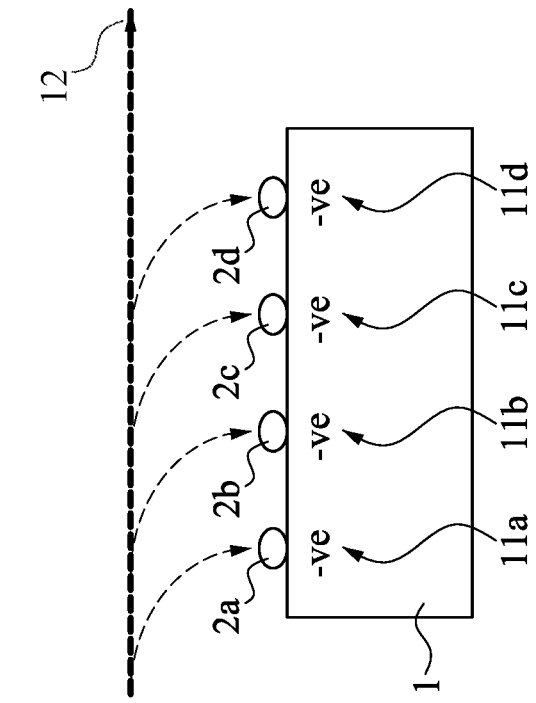
FIGS. 4A-4C illustrate a method of depositing gallium seeds and subsequently forming germanium nanowires using VLS, in accordance with some embodiments.
Figure 4A:
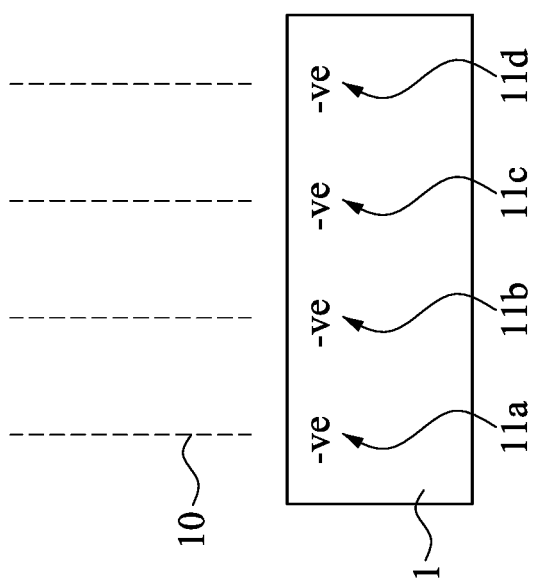
Figure 4C:
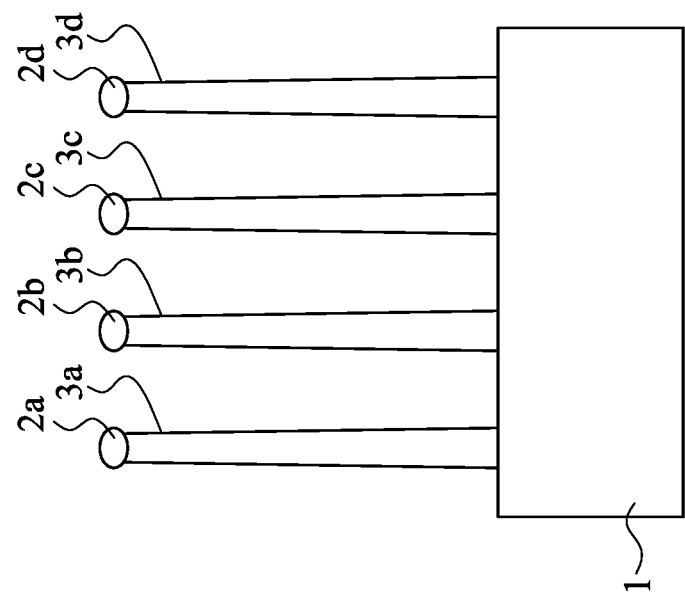

FIGS. 4A-4C illustrate steps of a method of the disclosure, in accordance with some embodiments. As shown in FIG. 4A, an electron beam 10 is used to charge location(s) 11a-11d of the substrate 1. Any suitable electron beam may be used to negatively charge the substrate in any desired pattern. Suitable electron beams charge the substrate without causing damage or other undesired changes to the substrate. In embodiments, electron beam lithography is used. In some embodiments, a scanning electron beam is used.

In embodiments, one location 11a is charged. In other embodiments, multiple locations 11a-11d are charged in a pre-determined pattern. In some such embodiments, locations 11a-11d have a same charge. In other embodiments, at least two of locations 11a-11d have charges of different magnitudes.

As shown in FIG. 4B, a Ga ion beam 12 is then directed across the surface of the substrate 1. In embodiments, the Ga ion beam 12 is directed substantially parallel to the surface of the substrate 1. In some embodiments, the Ga ion beam 12 is directed substantially parallel to the surface of the substrate 1 and over one or more of the locations 11a-11d. Ga seeds 2a-2d are formed as Ga ions are attracted to and deposited on the surface of the substrate 1 at charged locations 11a-11d, respectively.

As described above, the diameter of the Ga seed deposited correlates to the diameter of the resulting nanowire. The size of the Ga seed deposited on the substrate may be affected by the distance between the path of the Ga ion beam and the surface of the substrate. Accordingly, it may be desirable to modulate the distance between the path of the Ga ion beam and the surface of the substrate in order to produce Ga seed(s) of the desired size.

Additionally, the Ga ion beam voltage and ion beam current may affect the size of the Ga seed deposited onto the substrate. In embodiments, the ion beam current is altered, which alters the diameter of the ion beam, and, in turn, the size of the Ga seed deposited on the substrate. Thus, the ion beam voltage, the ion beam current, or both could be modulated in order to produce Ga seed(s) of the desired size. In embodiments, the ion beam voltage is no greater than about 30 kV. In some embodiments, the ion beam voltage is less than 30 kV. In some embodiments, the ion beam voltage ranges from about 5 kV to about 30 kV. In particular embodiments, the ion beam voltage is about 30 kV. In embodiments, the ion beam current is no greater than about 1000 pA. In some embodiments, the ion beam current is less than 1000 pA. In some embodiments, the ion beam current ranges from about 1 pA to about 1000 pA. In such embodiments, the Ga seed deposited may have a diameter ranging from about 1 nm to about 60 nm. In particular embodiments, the ion beam current is about 40 pA.

Nanowires may then be formed using methods of the disclosure, as shown in FIG. 4C, and as described above with regard to FIGS. 1B and 1C. As can be seen in FIG. 4C, such methods result in single directional, ordered growth of nanowires. Such ordered growth may be advantageous as compared to other methods of growing nanowires that result in multidirectional growth.

Alternatively, or in addition, the Ga ion beam may be directed at the surface of the substrate (e.g., substantially perpendicular to a surface of the substrate) in order to deposit a Ga seed. In some embodiments, an electron beam is used to charge a first location on a substrate, and a Ga ion beam is directed at the surface of the substrate at a second location. In such embodiments, a first Ga seed would be deposited at the first, charged location, and a second Ga seed would be deposited at the second location where the Ga ion beam reached the substrate. Nanowires may then be formed using methods of the disclosure, such as are described above with regard to FIGS. 1B and 1C.

In various embodiments, nanowires of the present disclosure may further include one or more sections of a second semiconductor material. Steps of a method to form nanowires having sections of two or more semiconductor materials are illustrated in FIGS. 5A-5E, in accordance with some embodiments. The steps illustrated in FIGS. 5A-5C may be as described above with regard to FIGS. 1A-1C, FIGS. 2A-2C, or FIGS. 4A-4C.

Figure 5C:
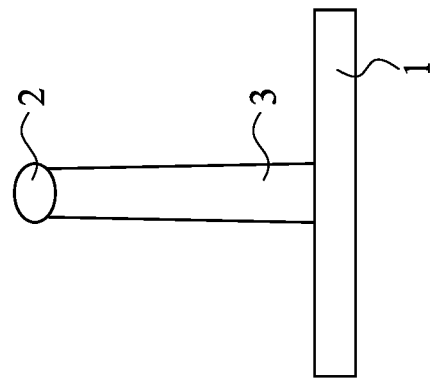
FIGS. 5A-5E illustrate a method of forming a germanium nanowire using VLS, in accordance with some embodiments.
Figure 5B:
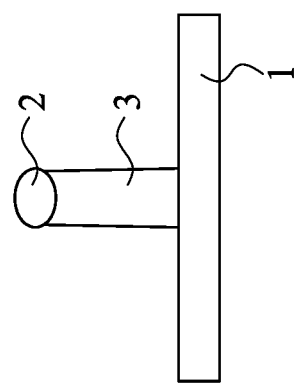
Figure 5A:
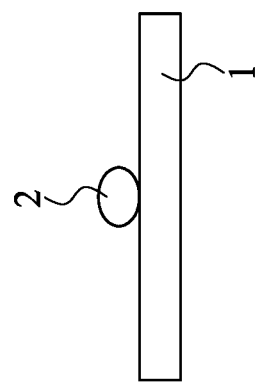

During the formation process of nanowires of the present disclosure that include one or more sections of a second semiconductor material, Ga seed 2 is exposed to a first vapor (e.g., a Ge vapor or Ga-containing vapor) until the first section 13 has reached a desired length, as shown in FIG. 5C. In embodiments, the first section 13 of the nanowire 3 is Ge. In other embodiments, the first section 13 is a second semiconductor material. In some embodiments, a nanowire of the disclosure may comprise a first section of a second semiconductor material on a substrate of the same material. In some embodiments, the second semiconductor material is a Ga-containing semiconductor material. In some embodiments, the second semiconductor material is GaAs. In other embodiments, the second semiconductor material is a different Ga-containing semiconductor material, such as GaSb, InGaAs, InGaSb, InGaAsSb, and the like.

Figure 5E:
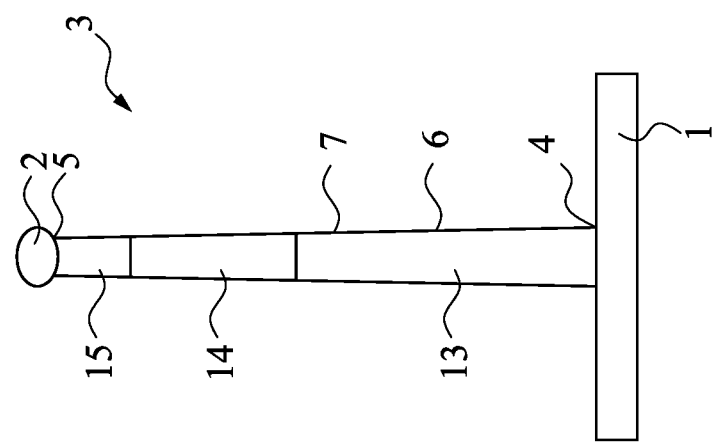
Figure 5D:
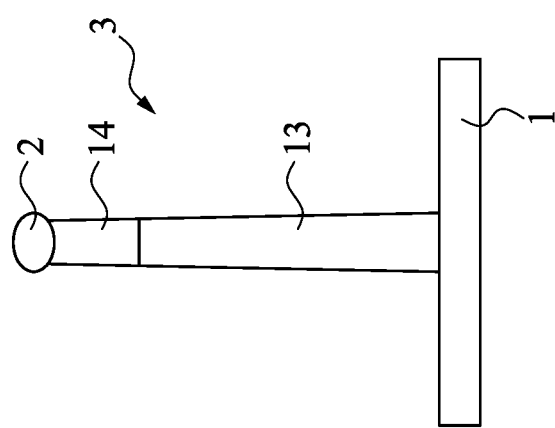

The first vapor can then be stopped and a second semiconductor vapor can be introduced to produce a second section 14 of the nanowire 3, as shown in FIG. 5D. In certain embodiments, the first section 13 includes Ge and the second section 14 includes a second semiconductor material. In other embodiments, the first section 13 includes the second semiconductor material and the second section 14 includes Ge.

In embodiments, after the second section 14 has reached a desired length, the second vapor can be stopped and the first vapor may be introduced to produce a third section 15, as shown in FIG. 5E. In some embodiments, after the second section 14 has reached a desired length, the second vapor can be stopped and a third vapor having a different composition than the second vapor may be introduced to produce a third section 15. In embodiments, such steps are repeated to produce several sections of alternating materials. In embodiments, such steps are repeated to produce several sections of different materials. Any suitable pattern or order of sections may be formed using methods of the disclosure. In other embodiments, the nanowire formation is complete after the second section 14 is formed.

In embodiments, the interfaces created have low defectivity. The term defectivity refers to the level of defects in the interface, considering the size of the defects and/or defect density (i.e., the number of defects per unit area). In embodiments, "low" defectivity indicates that the defectivity of the interface is no more than about $1\times10^{11}$ cm$^{-2}$. In embodiments, low defectivity indicates that the defectivity of the interface is less than $1\times10^{11}$ cm$^{-2}$. In some embodiments, the interfaces created have substantially zero defectivity. In particular embodiments, the interfaces created have no defects.

Embodiments of the present disclosure include a device that comprises one or more of the nanowires described herein. In embodiments, a device comprises a plurality of nanowires of the disclosure. In embodiments, a nanowire of the disclosure is used to form a tunneling field effect transistor (TFET). In such embodiments, a nanowire of the disclosure may comprise a first section of a second semiconductor material on a substrate of the same material. A section of Ge nanowire may be formed on the first section using the methods described herein. A second section of the second semiconductor material can then be formed on the Ge nanowire section. In certain embodiments, a nanowire of the disclosure may comprise a section of GaAs nanowire on a GaAs substrate. A section of Ge nanowire may be formed on the GaAs nanowire section using the methods described herein. A second GaAs nanowire section can then be formed on the Ge nanowire section. In embodiments, the GaAs—Ge interfaces created have low defectivity. In embodiments, the GaAs—Ge interfaces created have substantially zero defectivity.

In embodiments, one or more nanowires of the disclosure are used in CMOS circuits. Nanowires of the present disclosure can have sections that are doped, as described above, and can be used to connect various layers of CMOS logic. Accordingly, in some such embodiments, the device comprises vertically stacked CMOS logic.

Nanowires of the disclosure provide highly scaled and well-defined vertical channels. Accordingly, in embodiments, a device comprises one or more vertical field effect transistors (FET).

The present disclosure provides, in various embodiments, a nanowire that includes a section that comprises Ge and Ga, and that has a larger diameter at a location closer to the substrate than at a location that is farther from a substrate.

Embodiments of the present disclosure further include a device that includes a nanowire with a first end on a substrate and a second end opposite the first end, where a section of the nanowire comprises Ge and Ga, and the second has a larger diameter at a location closer to the substrate than at a location that is farther from a substrate.

Further embodiments of the present disclosure include methods comprising forming a Ga seed on a substrate and forming a nanowire using the Ga seed, where the nanowire includes a section that comprises Ge and Ga, and that has a larger diameter at a location closer to the substrate than at a location that is farther from a substrate.

Embodiments of the present disclosure also include methods comprising depositing a Ga seed at a location on a surface of a substrate by charging the location on the substrate using an electron beam, and directing a Ga ion beam in a direction that is substantially parallel to the surface of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
 forming a dielectric layer on a substrate;
 forming an opening in the dielectric layer formed on the substrate to expose a portion of the substrate;
 forming a gallium seed on the exposed portion of the substrate within the formed opening; and
 forming a nanowire using the gallium seed, the nanowire extending within the formed opening and through the dielectric layer, the nanowire comprising a straight section comprising germanium and gallium, the straight section having a first diameter at a first location and a second diameter at a second location that is farther from the substrate than the first location, the first diameter being larger than the second diameter;
 wherein the nanowire is formed by exposing the gallium seed to a vapor comprising germanium;
 wherein the vapor is $Ge_2H_6$; and
 wherein the gallium seed is exposed to the vapor at a temperature ranging from about 330° C. to about 500° C.

2. The method of claim 1, wherein the gallium seed is formed by:
 charging the exposed portion of the substrate using an electron beam; and
 directing a gallium ion beam over the exposed portion in a direction that is substantially parallel to the surface of the substrate.

3. The method of claim 1, wherein the gallium seed has an average diameter of no more than 25 nm.

4. The method of claim 1, wherein the straight section exhibits a ratio of effective length to actual length ranging between about 0.8 to 1.0.

5. A method, comprising:
 forming a dielectric layer on a substrate;
 forming an opening in the dielectric layer formed on the substrate to expose a portion of the substrate;
 depositing a gallium seed on the exposed portion of the substrate through the opening in the dielectric layer, the depositing comprising:
  charging a location on a surface of the substrate exposed by the opening in the dielectric layer; and
  directing a gallium ion beam over the location in a direction that is substantially parallel to the surface of the substrate;
 forming a nanowire extending through the dielectric layer and extending within the opening by exposing the gallium seed to a vapor comprising germanium, the nanowire being substantially straight and comprising germanium and gallium;
 wherein the vapor is $Ge_2H_6$; and
 wherein the gallium seed is exposed to the vapor at a temperature ranging from about 330° C. to about 500° C.

6. The method of claim 5, wherein the gallium seed has an average diameter of no more than 25 nm.

7. The method of claim 5, wherein the charging the location comprises using an electron beam.

8. The method of claim 5, wherein the substantially straight section exhibits a ratio of effective length to actual length ranging between about 0.8 to 1.0.

9. A method, comprising:
 forming a dielectric layer on a substrate;
 forming a plurality of recesses in the dielectric layer formed on the substrate to expose a portion of the substrate;
 after formation of the plurality of recesses and exposing a portion of the substrate, forming a plurality of gallium seeds on the exposed portion of the substrate in respective recesses of the plurality of recesses; and
 forming a plurality of nanowires by exposing the plurality of gallium seeds to a vapor comprising germanium, each nanowire of the plurality of nanowires comprising germanium and gallium and extending through the dielectric layer and extending within the respective recesses;
 wherein the plurality of gallium seeds is formed by:
 charging the exposed portion of the substrate; and
 directing a gallium ion beam over the charged exposed portion of the substrate in a direction that is substantially parallel to the surface of the substrate;
 wherein the charging the plurality of locations comprises using an electron beam;
 wherein the vapor is $Ge_2H_6$; and
 wherein the plurality of gallium seeds is exposed to the vapor at a temperature ranging from about 330° C. to about 500° C.

10. The method of claim 9, wherein one or more of the plurality of gallium seeds has an average diameter of no more than 25 nm.

11. The method of claim 9, wherein the plurality of nanowires include a straight section exhibiting a ratio of effective length to actual length ranging from about 0.8 to 1.0.

* * * * *